(12) United States Patent
Yen

(10) Patent No.: US 11,195,922 B2
(45) Date of Patent: Dec. 7, 2021

(54) SILICON CARBIDE SEMICONDUCTOR DEVICE

(71) Applicant: Fast SiC Semiconductor Incorporated, Hsinchu (TW)

(72) Inventor: Cheng-Tyng Yen, Hsinchu (TW)

(73) Assignee: FAST SIC SEMICONDUCTOR INCORPORATED, Hsinchu (TW)

( * ) Notice: Subject to any disclaimer, the term of this patent is extended or adjusted under 35 U.S.C. 154(b) by 0 days.

(21) Appl. No.: 16/892,383

(22) Filed: Jun. 4, 2020

(65) Prior Publication Data
US 2021/0013309 A1    Jan. 14, 2021

Related U.S. Application Data

(60) Provisional application No. 62/872,737, filed on Jul. 11, 2019.

(51) Int. Cl.
```
H01L 29/16     (2006.01)
H01L 29/872    (2006.01)
H01L 29/47     (2006.01)
```

(52) U.S. Cl.
CPC .......... *H01L 29/1608* (2013.01); *H01L 29/47* (2013.01); *H01L 29/872* (2013.01)

(58) Field of Classification Search
CPC ..... H01L 29/16; H01L 29/16; H01L 29/1608; H01L 29/47; H01L 29/87; H01L 29/872
USPC ....................................................... 257/77
See application file for complete search history.

(56) References Cited

U.S. PATENT DOCUMENTS

| 6,861,723 | B2 | 3/2005 | Willmeroth |
| 8,232,558 | B2 | 7/2012 | Zhang et al. |
| 9,117,739 | B2 * | 8/2015 | Zhang ............... H01L 29/66068 |

OTHER PUBLICATIONS

Rupp, et al.: "Current distribution in the various functional areas of a 600V SiC MPS diode in forward operation"; Materials Science Forum vols. 717-720 (2012); pp. 929-932; Online available since May 14, 2012 at www.scientific.net © (2012); Trans Tech Publications, Switzerland doi:10.4028/www.scientific.net/MSF.717-720.929.

* cited by examiner

*Primary Examiner* — Monica D Harrison
(74) *Attorney, Agent, or Firm* — McClure, Qualey & Rodack, LLP

(57) ABSTRACT

A silicon carbide semiconductor device includes a drift layer having a first conductivity type and a surface in which an active region is defined; a plurality of first doped regions having a second conductivity and arranged within the active region; a plurality of second doped regions having a second conductivity and arranged within the active region; and a metal layer disposed on the surface of the drift layer and forming a Schottky contact with the drift layer. Each of the first doped regions has a first minimum width and a first area and are spaced from each other by a first minimum spacing Each of the second doped regions has a second minimum width greater than the first minimum width and a second area greater than the first area and are spaced from the first doped region by a second minimum spacing less than the first minimum spacing.

16 Claims, 7 Drawing Sheets

SILICON CARBIDE SEMICONDUCTOR DEVICE

This application claims the benefit of U.S. provisional application Ser. No. 62/872,737, filed Jul. 11, 2019, the subject matter of which is incorporated herein by reference.

BACKGROUND

Technical Field

The disclosure in generally relates to a semiconductor device, and more particularly to a silicon carbide semiconductor device having Schottky barriers.

Description of the Related Art

A Schottky barrier diodes (SBDs) that takes advantage of the metal-semiconductor junction created between a metal layer and a doped semiconductor layer provide two unique advantages over traditional PiN diodes. First, the Schottky barrier of the SBDs has a built-in potential lower than that of a PiN diode, which correlates to lower forward voltage drops. As such, a smaller forward voltage is required to turn on the SBDs and allow current to flow in a forward-biased direction. Second, the SBDs is unipolar device, only one type of carrier (typically electrons) participates the conducting current, on the other hand, both types of carries (electrons and holes) participate in the conducting process of PiN diodes which results in long reverse recovery time and large reverse recovery current before the PiN diodes being able to block reverse voltages, limits the switching speed and increases switching losses Because of lower bandgap of silicon (1.1 eV), the SBDs made of silicon can only be realized for blocking voltages lower than 300V. In the meantime, the SBDs made of Silicon carbide (SiC) can withstand up to 3300V of bias voltage, and commercialized SiC SBDs with voltage rating from 650V to 1700V have been widely used in power electronics. However, under high reverse bias the barrier height of SBDs will be reduced because of barrier lowering effect caused by electric field exerting on the semiconductor-metal interface, which will lead to increased reverse leakage current or even premature breakdown of plain SBD devices.

In order to reduce such leakage currents, structures such as junction barrier Schottky (JBS) diodes or merged PiN Schottky (MPS) diodes have been used to shield the electric field exerting on the barrier under reverse bias. where Schottky barrier contact are formed on the surface of the n-type drift layer between heavily doped p-type (p+) regions, the depletion of p-n junctions formed by those p+ regions and n-type drift layer is faster than Schottky contact and thus provide good shielding if the spacing between those p+ regions are appropriately designed according to the doping concentration of n-type drift layer and targeted voltage ratings. Generally, if the spacing between p-type doped regions is smaller, the leakage current will be lower because of better pinch-off of electric field during the reverse bias, however, a smaller spacing between p-type regions also increases the differential resistance of JIBS/MPS diodes during turn-on because of increased JFET channel resistance.

Another advantage of JBS/MPS diodes compared to plain SBDs is the ability to handle forward surge currents. For example, during the transient of start-up of power supplies, a high inrush current may occur and have to be conducted. Under such conditions, the p-n junctions in the JBS/MPS diodes would turn on and start to inject minority carriers (holes) which modulate the conductivity of drift layer, lower the resistance and reduce generated heat to avoid the thermal run-away failure of the device.

Ideally, SiC JBS/MPS diodes require specific differential resistance (differential resistance multiply by active area, $R*A$ or $r_{sp}$, in the unit of m $\Omega \cdot cm^2$) to be as low as possible. A low specific differential resistance allows higher forward current density, and enable smaller chip size for the same rated current. This is not only beneficial to the cost but also reduce the capacitive charge (Qc) which dominates the switching related power losses in SiC Schottky diodes. A larger ratio of Schottky region reduces specific differential resistance, but increasing the ratio of p+ region improves the capability to withstand surge current for example in U.S. Pat. Nos. 6,861,723 and 8,232,558, Sometimes the p+ region occupies up to 50% of active region area for example in Mater. Sci. Forum, 717, pp. 929-932, 2012. There is a trade-off between reducing specific differential resistance $R*A$ and maintaining good capability to withstand forward surge current.

SUMMARY

One aspect of the present disclosure is to provide a silicon carbide semiconductor device, wherein the silicon carbide semiconductor device includes a drift layer, a plurality of first doped regions, a plurality of second doped regions and a metal layer. The drift layer has a first conductivity type and a surface in which an active region is defined. The plurality of first doped regions have a second conductivity and are arranged regularly within the active region; wherein each of the plurality of first doped regions has a first minimum width and a first area and spaced from each other by a first minimum spacing. The plurality of second doped regions have a second conductivity and are arranged regularly within the active region; wherein each of the plurality of second doped regions has a second minimum width greater than the first minimum width and a second area greater than the first area and spaced from the first doped region by a second minimum spacing that is less than the first minimum spacing. The metal layer is disposed on the surface of the drift layer and forms a Schottky contact with the drift layer.

Another aspect of the present disclosure is to provide a silicon carbide semiconductor device, wherein the silicon carbide semiconductor device includes a drift layer, a plurality of first doped regions, a plurality of second doped regions, at least one third doped region and a metal layer. The drift layer has a first conductivity type and a surface in which an active region is defined. The plurality of first doped regions have a second conductivity and are arranged regularly within the active region; wherein each of the plurality of first doped regions has a first minimum width and a first area and spaced from each other by a first minimum spacing. The plurality of second doped regions have the second conductivity and are arranged regularly within the active region; wherein each of the plurality of second doped regions has a second minimum width greater than the first minimum width and a second area greater than the first area and spaced from the first doped region by a second minimum spacing that is less than the first minimum spacing. The at least one third doped region has the second conductivity arranged within the active region; wherein the at least one third doped region is significantly larger than each of the plurality of first doped regions. The metal layer is disposed on the surface of the drift layer and forms a Schottky contact with the drift layer.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1A:
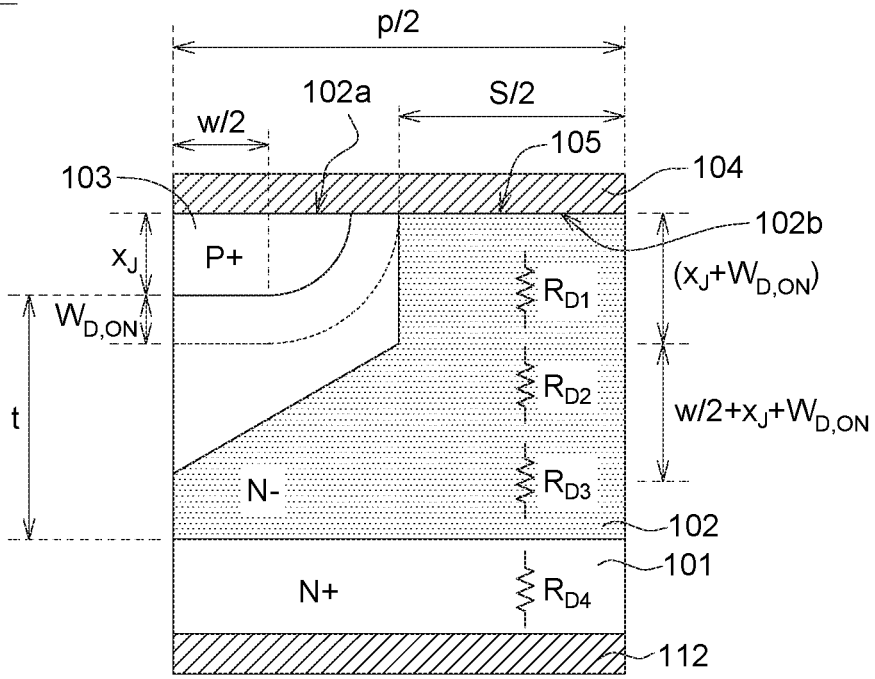
FIG. 1A is a cross-sectional view illustrating a SiC JBS/MPS diode according to one embodiment of the present disclosure.

The embodiments as illustrated below to provide a silicon carbide semiconductor device with a Schottky barrier contact, which has ability of reducing specific differential resistance while maintaining low reverse leaking current leakage and good forward surge current withstand capability. The present disclosure will now be described more specifically with reference to the following embodiments and the accompanying drawings illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

Figure 1B:
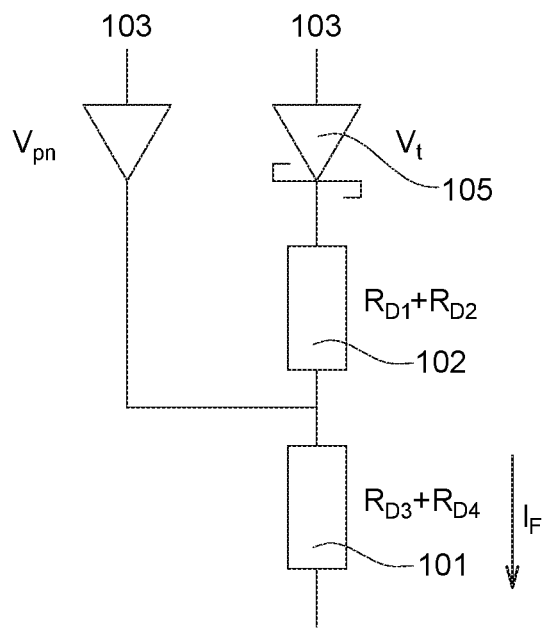
FIG. 1B is a simplified circuit diagram of the SiC JBS/MPS diode as depicted in FIG. 1A.

FIG. 1A is a cross-sectional view illustrating a SiC JBS/MPS diode 100 in accordance with one embodiment of the present disclosure; FIG. 1B is a simplified circuit diagram of the SiC JBS/MPS diode 100 as depicted in FIG. 1A. The SiC JBS/MPS diode 100 includes a cathode 112, a heavily doped n-type SiC substrate 101, a lightly doped n-type drift layer 102, a heavily doped p-type region (p+ doped region) 103 and a metal layer 104. Wherein, the heavily doped n-type SiC substrate 101 is disposed on the cathode 112. The n-type drift layer 102 is formed on a top of the heavily doped n-type SiC substrate 101 and usually formed by epitaxial process with heavily doped p-type regions implanted into the n-type drift layer on the surface; and the p+ doped region 103 extends into the n-type drift layer 102 from a surface 102a of the n-type drift layer 102. The metal layer 104 is disposes on the n-type drift layer 102 and forms a Schottky barrier contact (Schottky region) 105 with the n-type region 102b of the n-type drift layer 102 on its surface. The half cell series specific resistances of the SiC JBS/MPS diode 100 along the current path when the device is forward biased include channel resistance ($R_{D1}$), spreading resistance ($R_{D2}$), drift resistance ($R_{D3}$), and substrate resistance ($R_{D4}$), $$R_{D1} = \rho_{drift} \frac{p(x_j + W_{D,on})}{s} \quad (1)$$

$$R_{D2} = \rho_{drift} \cdot \frac{p}{2} \cdot \ln\left(\frac{p}{s}\right) \quad (2)$$

$$R_{D3} = \rho_{drift}(t - w/2 - x_j - 2W_{D,on}) \quad (3)$$

$$R_{D4} = \rho_{drift} \cdot t_{sub} \quad (4)$$

Wherein p is the width of cell pitch, w is the width of p+ doped region 103, s is the width of the Schottky region 105, $W_{D,on}$ is the depletion width of the n-type region 102b, and $x_j$ is the junction depth of p+ doped region 103, $\rho_{drift}$ is the resistivity of the n-type drift layer 102, $\rho_{sub}$ is the resistivity of the n-type SiC substrate 101.

The voltage drop when the SiC JBS/MPS diode 100 is forward biased ($V_F$) can then be written as, $$V_F = J_F \cdot (R_{D1} + R_{D2} + R_{D3} + R_{D4}) + V_t \quad (5)$$

Where $J_F$ is the forward current density, $V_t$ is the cut-in voltage of Schottky diode (Schottky region 105). From (1) and (2), if the ratio of Schottky region 105 to the width of cell pitch (s/p) is larger, the specific differential resistance will be lower.

Figure 2A:
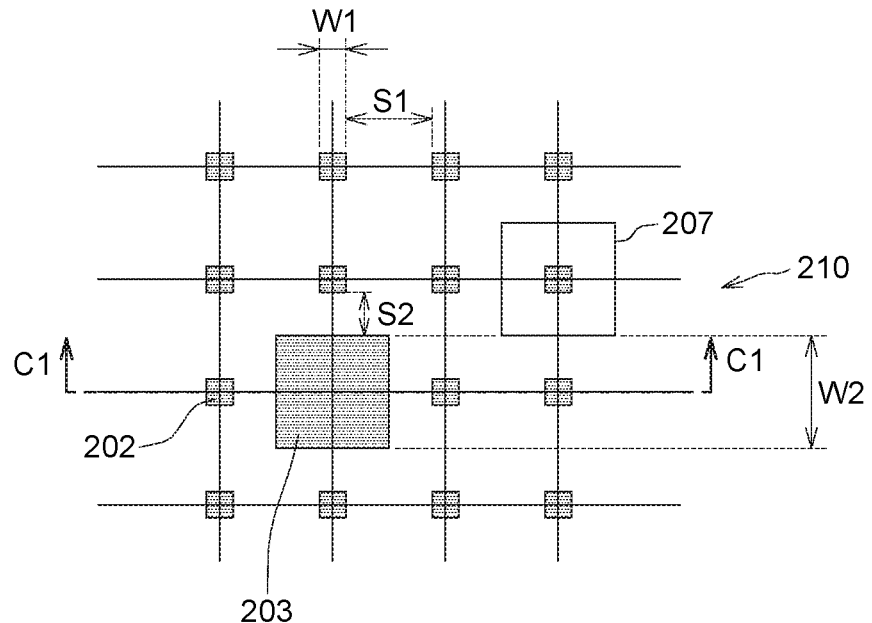
FIG. 2A is a top view illustrating a portion of a silicon carbide semiconductor device according to one embodiment of present disclosure.
Figure 2B:
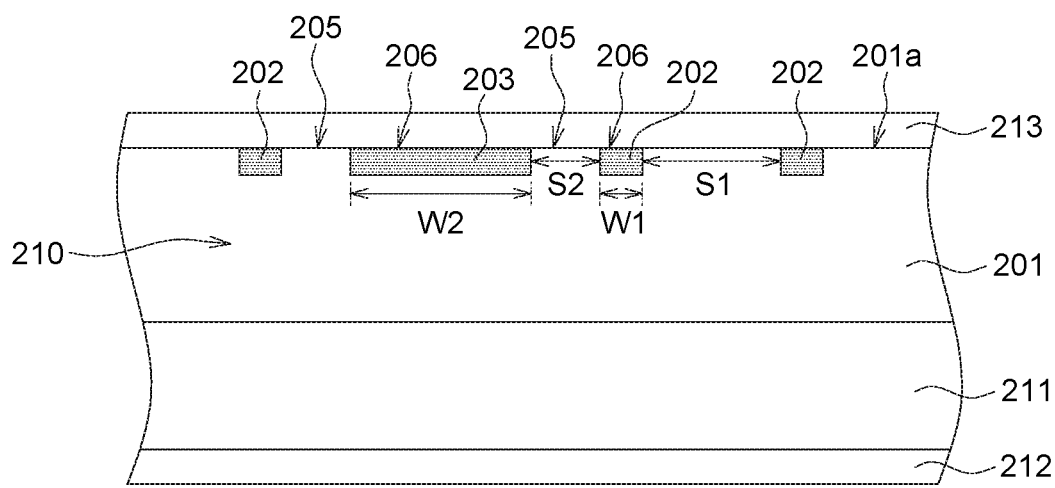
FIG. 2B illustrates the cross-sectional view of the silicon carbide semiconductor device 200 taken along the section line C1 depicted in FIG. 2A.

FIG. 2A is a top view illustrating a portion of a silicon carbide semiconductor device 200. FIG. 2B illustrates the cross-sectional view of a silicon carbide semiconductor device 200 taken along the section line C1 depicted in FIG. 2A. The silicon carbide semiconductor device 200 includes a substrate 211, a drift layer 201, a plurality of first doped regions 202, a plurality of second doped regions 203 (in FIGS. 2A and 2B mere one of the plurality of second doped regions is shown), a cathode contact 212 and an anode metal layer 213.

Wherein the drift layer 201 is formed on one side of the substrate 211; the cathode contact 212 is formed on the other side of the substrate 211 opposite to the drift layer 202. The drift layer 201 has an upper surface 201a in which at least one active region 210 is defined. The plurality of first doped regions 202 and the plurality of second doped regions 203 both having p-type conductivity are formed in the active region 210.

The cathode contact 212 includes a metal, such as nickel, that is capable of forming an ohmic contact to n-type silicon carbide of the substrate 211.

The drift layer 201 is, for example, n-type silicon carbide of the 2H, 4H, 6H, 3C or 15R polytype having a doping concentration of about (but not limited to) $2\times10^{14}$ cm$^{-3}$ to $1\times10^{17}$ cm$^{-3}$, depending on design requirements for voltage blocking and specific differential resistance for the silicon carbide semiconductor device 200.

The first doped regions 202 and the second doped regions 203 may be formed, for example, by ion implantations of p-type dopants such as aluminum or boron, and preferably aluminum, into the n-type drift layer 201. In some embodiments of the present disclosure the plurality of first doped regions 202 and the second doped regions 203 may be formed simultaneously by ion implantations and have the same doping concentration ranged from (but not limited to) $1\times10^{18}$ cm$^{-3}$ to $3\times10^{19}$ cm$^{-3}$.

In some other embodiments, the first doped regions 102 and the second doped region 103 may also be formed by separate ion implantations have different doping concentrations.

The anode metal layer 213 is disposed on the surface of the drift layer 201 in contact with the surface 201a of the drift layer 201 as well as the first doped regions 202 and the second doped region 203. The anode metal layer 213 includes titanium, aluminum, or nickel, that forms Schottky contact 205 with the n-type drift layer 201 unoccupied by the first doped regions 202 and the second doped regions 203 and forms Ohmic contact 206 with the first doped regions 202 and the second doped regions 203.

Figure 3:
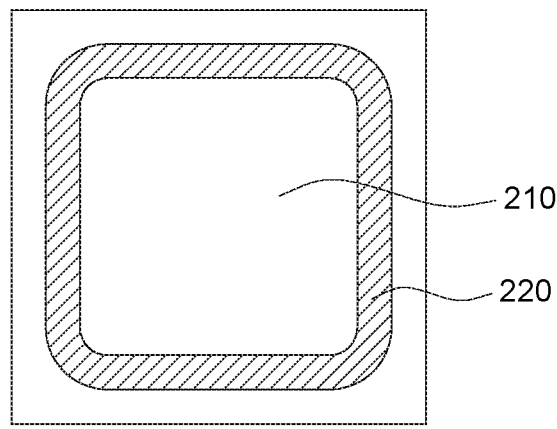
FIG. 3 is a top view of the silicon carbide semiconductor device.

FIG. 2A is a top view illustrating a portion of the active region 210 of the silicon carbide semiconductor device 200 which includes the first doped regions 202 and the second doped regions 203 according to one embodiment of present disclosure. As illustrated in FIG. 3, the active region 210 is the region surrounded by junction termination region 220 such as p-type guard rings or JTE (junction termination extension).

The first doped regions 202 are regularly arranged within the active region of the silicon carbide semiconductor device 200. "Regularly arranged" of the first doped regions 202 should be preferably be regarded as meaning the centroid of the first doped regions 202 should be located at the centroid of unit cells 207 arranged by Euclidean tilings of regular polygons. In the present embodiment shown in FIG. 2A, each of the unit cell 207 has a shape of square and the first doped region 202 arranged in the unit cell 207 also has a shape of square at its centroid. The first doped regions 202 has a first minimum width W1, a first area A1 and is spaced from each other by a first minimum spacing S1. In the present embodiment according to FIGS. 2A and 2B, W1 is the side length of the square first doped regions 202 and W1+S1 would be equal to the square side length of the corresponding unit cell 207. The second doped regions 203 are regularly arranged within the active region 210. "Regularly arranged" of the second doped region should be preferably regarded as meaning the centroid of the second doped region 203 should also be located at the centroid of the corresponding unit cell 207, replacing some of the first doped regions 202 at those positions and are repeated by a certain multiple of unit cells 207. The multiple is preferably be larger than 2. The second doped regions 203 has a second minimum width W2, a second area A2 and is spaced from the first doped region by a second minimum pacing S2. The second minimum width W2 is greater than the first minimum width W1 and the second minimum spacing S2 is less than the first minimum spacing S1.

By using the second minimum width W2 is greater than the first minimum width W1 and the second minimum spacing S2 is less than the first minimum spacing S1, the capability to withstand surge current of the silicon carbide semiconductor device 200 can be improved, because the on-set voltage $V_{turn}$ to turn on of the PiN diode embedded in the SiC JBS/MPS as shown in FIG. 2B can be written as, $$V_{turn} = (V_{pn} - V_t)\frac{R_{D1} + R_{D2} + R_{D3} + R_{D4}}{R_{D1} + R_{D2}} + V_t \qquad (6)$$

By increasing the width of p+ region w (the second minimum width W2) and reducing the width of Schottky region s (the second minimum spacing S2), channel resistance $R_{D1}$ and spreading resistance $R_2$ would increase, and lowers the on-set voltage $V_{turn}$, enabling embedded PiN diode of the second doped regions 203 to be turned on earlier than the first doped region 202. The second doped regions 203 are preferably regularly arranged across the active region instead of piling on a certain portion of the active region 210. This is because the injected holes have inherently lower lifetime due to higher concentration of point defects in SiC compared to silicon. The distributed and earlier turned-on of the second doped regions 203 would provide better conductivity modulation effect.

The optimal first minimum spacing S1 depends on parameters including the doping concentration and the thickness of the n-type drift layer 201, the doping concentration and junction depth of the p-type first doped regions 202. And the first minimum spacing S1 should be at least larger than twice of the depletion width into the n-type drift region 201 at zero bias. For example in one of the embodiments, a 2 μm of the first minimum spacing S1 could provide low reverse leakage current at 650V when the n-type drift layer 201 has a doping concentration of $1\times10^{16}$ cm$^{-3}$ and a thickness of 5 μm, and the first doped region 202 has a doping concentration of $1\times10^{19}$ cm$^{-3}$ and a junction depth of 0.3 μm. The calculated depletion width into the n-type drift layer 201 is estimated to be about 0.57 μm, less than half of the first minimum spacing S1, ensuring conducting channel will not be pinched off.

The first minimum width W1 should be at least twice of the depletion width inside the first doped regions 202. For example, with the aforementioned doping concentrations of the n-type drift layer 201 and the p-type first doped regions 202, the estimated depletion width inside the first doped regions 202 is about 0.008 μm at reverse bias of 650V, suggesting that even a 0.02 μm of the first minimum width W1 would be enough to avoid fully depletion of the first doped region (where W1/(W1+S1)=0.02/(2.02)=0.099%).

In one of embodiments of the present disclosure, the first minimum width W1 for the square shape first doped regions 201 is 0.5 μm, and the first minimum spacing S1 for the square shape unit cell 207 is 2 μm; the second minimum width W2 for the square shape second doped regions 203 is 1 μm and the second minimum spacing S2 is 1.5 μm. If the silicon carbide semiconductor device 200 were including only the first doped regions 202, the p+ region would occupy only 4% of active region 210, provide good specific differential resistance but with limited capability to withstand surge current. If for example 50% of the first doped regions 202 were replaced by the second doped regions 203, the capability to withstand surge current can be improved, while the total area occupied by p+ regions is only 10% of the active region 210. By comparison, 2 μm width and 2 μm spacing square p+ regions would occupy 25% of active area. And the simulated $V_{turn}$ for width/spacing of 0.5 μm/2 μm, 1 μm/1.5 μm and 2 μm/2 μm cells would be 14.74V, 9.75V and 9.95V respectively.

Figure 4:
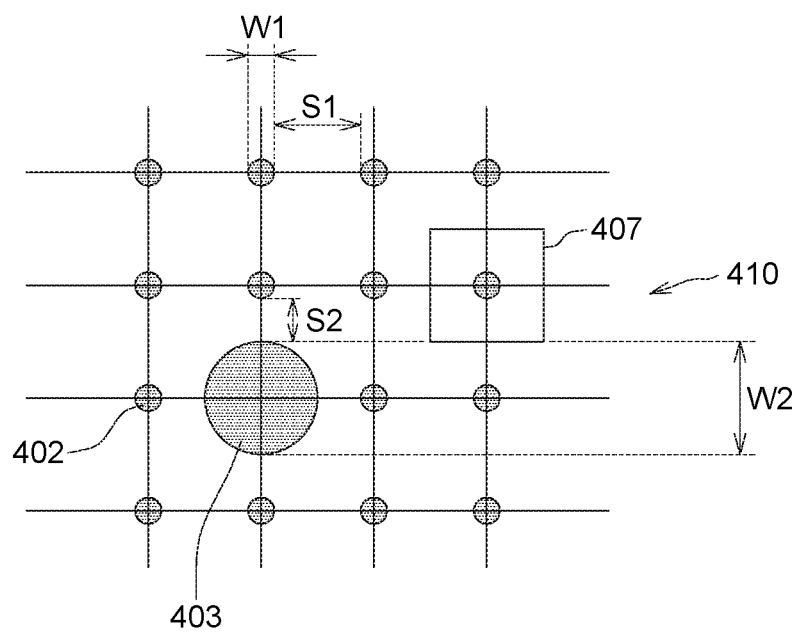
FIG. 4 is a partial top view of a silicon carbide semiconductor device according to another embodiment of present disclosure.

FIG. 4 is a partial top view of a silicon carbide semiconductor device 400 according to another embodiment of present disclosure. The structure of the silicon carbide semiconductor device 400 is similar to that of the silicon carbide semiconductor device 200 except for the shape of the first doped regions 402 and the shape of the second doped regions 403. In the present embodiment, the first doped regions 402 have a shape of circle and are regularly arranged in the active region 410 according to square shape unit cells 407. The second doped regions 403 also have a shape of circle, regularly arranged in the active region 410 and replaces some of the first doped regions 402 at those locations.

Figure 5:
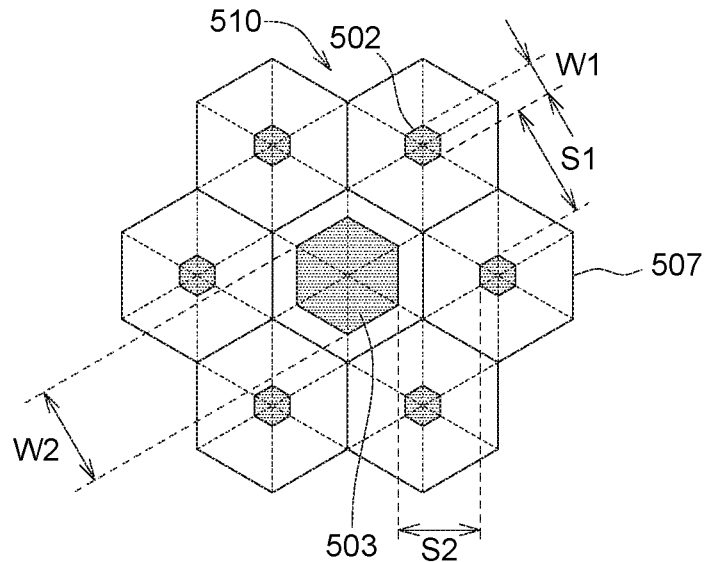
FIG. 5 is a partial top view of a silicon carbide semiconductor device according to yet another embodiment of present disclosure.

FIG. 5 is a partial top view of a silicon carbide semiconductor device 500 according to yet another embodiment of present disclosure. The structure of the silicon carbide semiconductor device 500 is similar to that of the silicon carbide semiconductor device 200 except for the shape of the first doped regions 502, the shape of the second doped regions 503 and the shape of the unit cells 507. In the present embodiment, the unit cells 507 have a shape of hexagon; the first doped regions 502 have a shape of hexagon and are regularly arranged in the active region 510 according to the tiling of the unit cells 507. The second doped regions 503 also have a shape of hexagon, regularly arranged in the active region 510 and replaces some of the first doped regions 502 at those locations.

Figure 6:
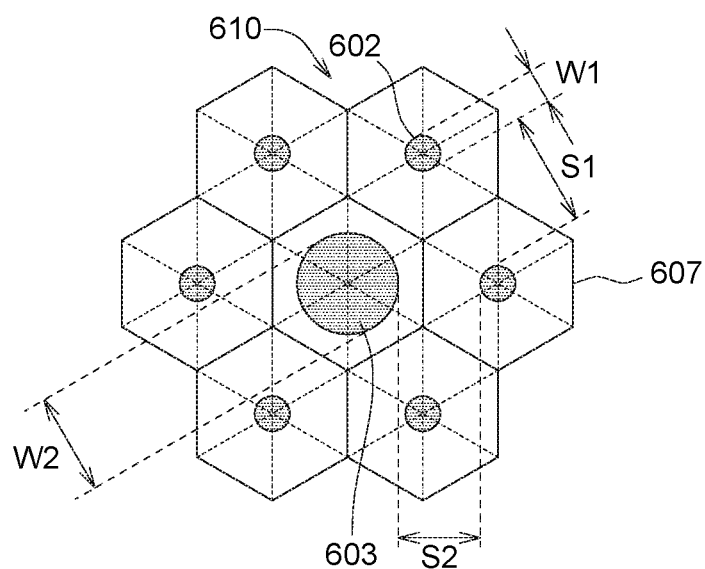
FIG. 6 is a partial top view of a silicon carbide semiconductor device according to yet another embodiment of present disclosure.

FIG. 6 is a partial top view of a silicon carbide semiconductor device 600 according to yet another embodiment of present disclosure. The structure of the silicon carbide semiconductor device 600 is similar to that of the silicon carbide semiconductor device 500 except for the shape of the first doped regions 602, the shape of the second doped regions 603 and the shape of the unit cells 607. In the present embodiment, the unit cells 607 have a shape of hexagon; the first doped regions 602 have a shape of circle and are regularly arranged in the active region 610 according to the tiling of the unit cells 607. The second doped regions 603 also have a shape of circle, regularly arranged in the active region 610 and replaces some of the first doped regions 602 at those locations.

Figure 7:
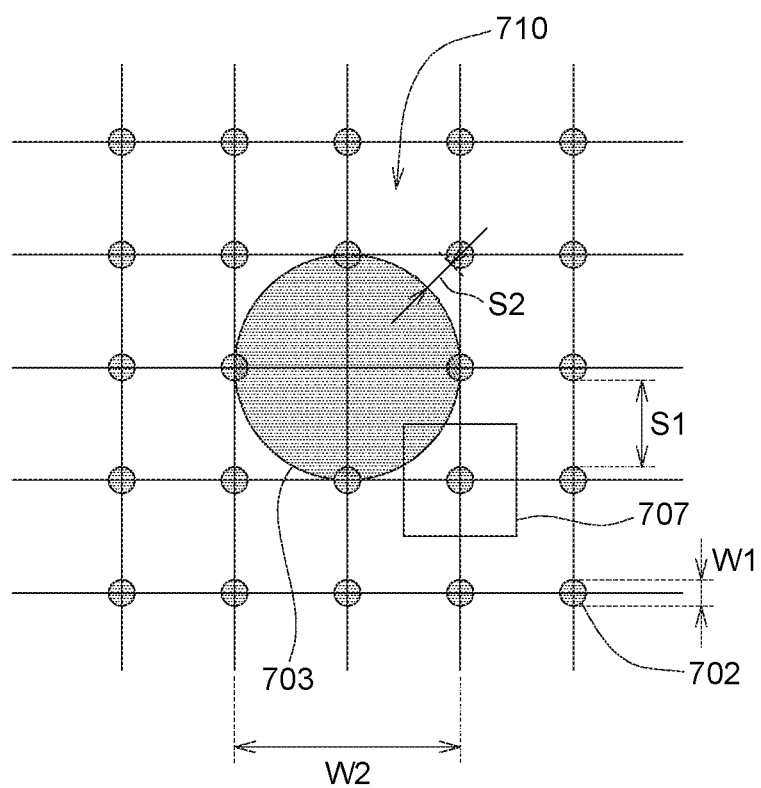
FIG. 7 is a partial top view of a silicon carbide semiconductor device according to yet another embodiment of present disclosure.

FIG. 7 is a partial top view of a silicon carbide semiconductor device 700 according to yet another embodiment of present disclosure. The structure of the silicon carbide semiconductor device 700 is similar to that of the silicon carbide semiconductor device 200 except for the size of the second doped region 703. In the present embodiment, the unit cells 707 have a shape of square; the first doped regions 702 have a shape of circle and are regularly arranged in the active region 710 according to the tiling of the unit cells 707. The second doped regions 703 also have a shape of circle, regularly arranged in the active region 710, where the second minimum width W2 is larger than the combination of the first minimum width W1 and the first minimum spacing S1 (i.e. W2>W1+S1) and some of the first doped regions 702 at those locations are fully or partially replaced by the second doped regions 703.

Figure 8A:
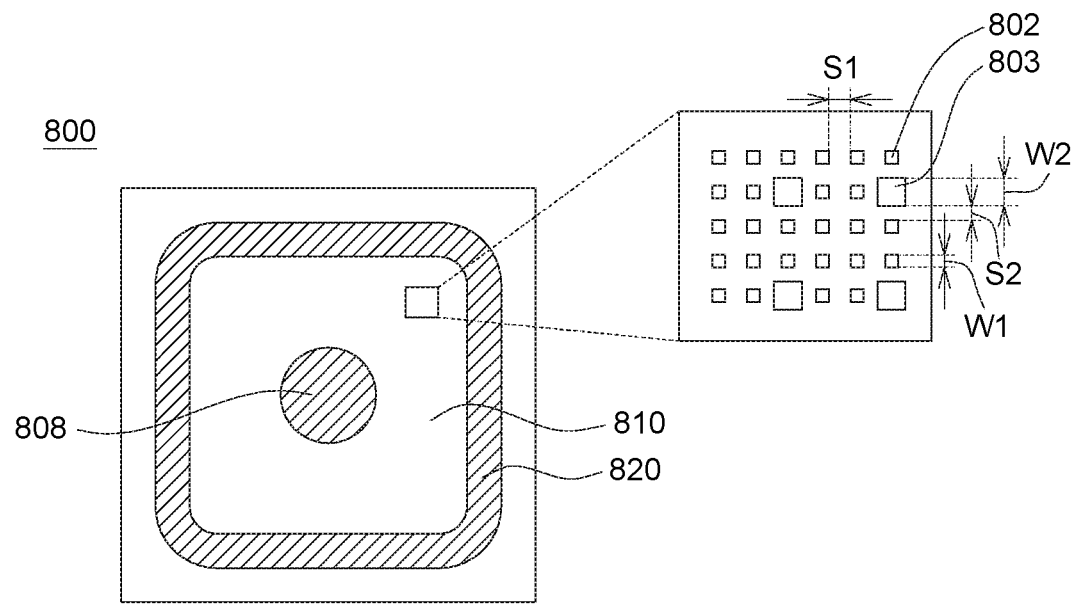
FIG. 8A is a top view of a silicon carbide semiconductor device according to yet another embodiment of present disclosure.
Figure 8B:
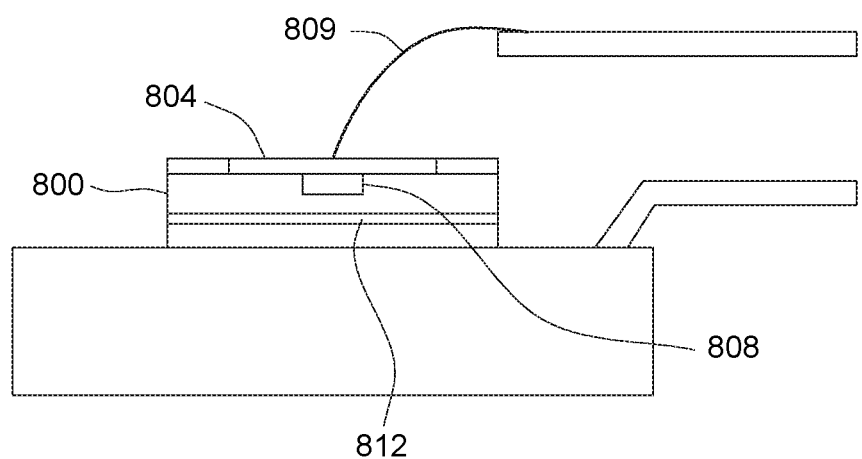
FIG. 8B is a cross-sectional view illustrating a discrete or module package of the silicon carbide semiconductor device as depicted in FIG. 8A.

FIG. 8A is a top view of a silicon carbide semiconductor device 800 according to yet another embodiment of present disclosure. The structure of the silicon carbide semiconductor device 800 is similar that of the silicon carbide semiconductor device 200 except for that at least one p-type third doped region 808 is arranged within the active region 810. In the present embodiment, the first doped regions 802 have a shape of square and are regularly arranged in the active region 810 according to square shape unit cells 807. The second doped regions 803 also have a shape of square, regularly arranged in the active region 810 and replaces some of the first doped regions 802 at those locations. Some of the first doped regions 802 and the second doped regions 803 are fully or partially replaced by the third doped regions 808 at where the third doped regions 808 are arranged. The third doped region 808 is significantly larger than each of the first doped regions 802. "Significantly larger" should be preferably regarded as meaning a minimum width of the third doped region 808 is at least 100 times larger the first minimum width W1 of the first doped regions 802. In the present embodiment as shown in FIG. 8A, there is one third doped region 808 having a shape of circle. The first minimum width W1 of the first doped regions 802 is 0.5 μm (which is the side length the first doped region square 802), and the minimum width of the third doped region is 50 μm (which is the diameter the third doped region circle 808). When assembling into a discrete or module packages, the cathode 812 of the silicon carbide semiconductor device 800 is die-attached to die-pad of a leadframe or a direct bonded copper (DBC) substrate and the anode 804 of the silicon carbide semiconductor device 800 is bonded to another pin by an interconnection such as aluminum wire, ribbon or a copper clip, as illustrated in FIG. 8B. Locations of the third doped regions 808 are preferably in accordance with the landing positions of the bonding wires 809 or clips on the silicon carbide semiconductor device 800. In the present embodiment, one wire is bonded to the center of the silicon carbide semiconductor 800, right above the third doped region 808 arranged at the center of the active region 810. For short duration pulses of surge current, such as 10 μs, the current will be confined to a limited lateral direction, a significantly larger third doped region 808 enables the embedded PiN diode to turn on faster and effectively absorb the transient high current.

Figure 9A:
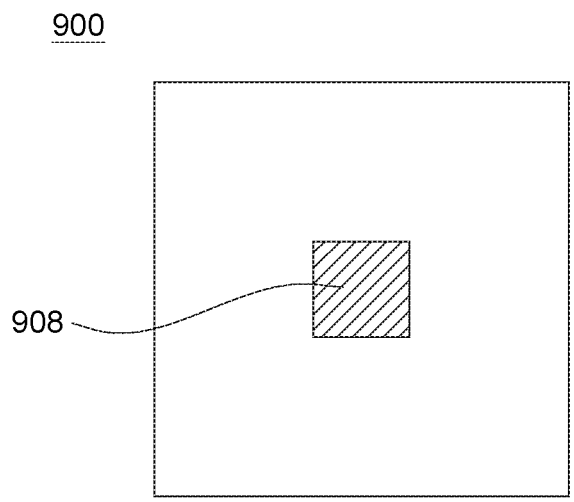
FIG. 9A is a top view of a silicon carbide semiconductor device according to another embodiment of present disclosure.
Figure 9B:
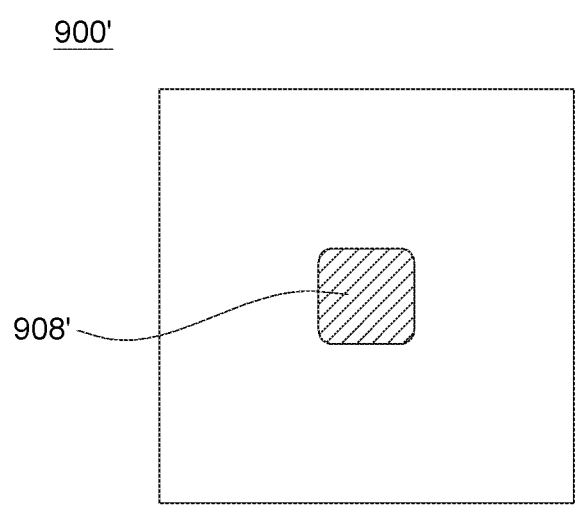
FIG. 9B is a top view of a silicon carbide semiconductor device according to yet another embodiment of present disclosure.

FIG. 9A is a top view of a silicon carbide semiconductor device 900 according to another embodiment of present disclosure. The structure of the silicon carbide semiconductor device 900 is similar to that of the silicon carbide semiconductor device 800 except for the shape of the third doped region 908. In the silicon carbide semiconductor device 900, the third doped region 908 has a shape of square. FIG. 9B is a top view of a silicon carbide semiconductor device 900' according to another embodiment of present disclosure. The structure of the silicon carbide semiconductor device 900 is similar to that of the silicon carbide semiconductor device 900 except for the shape of the third doped region 908'. In the silicon carbide semiconductor device 900', the third doped region 908' has a shape of square with rounded corners.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A silicon carbide semiconductor device, comprising:
    a silicon carbide drift layer, having a first conductivity type and a surface in which an active region is defined;
    a plurality of first silicon carbide doped regions, having a second conductivity arranged regularly by Euclidean tilings of regular polygons within the active region; wherein each of the plurality of first silicon carbide doped regions has a first minimum width and a first area and are spaced from each other by a first minimum spacing;
    a plurality of second silicon carbide doped regions having a second conductivity arranged regularly within the active region; wherein each of the plurality of second silicon carbide doped regions has a second minimum width greater than the first minimum width and a second area greater than the first area, and is spaced from the first silicon carbide doped regions by a second minimum spacing that is less than the first minimum spacing; and
    a metal layer disposed on the surface of the silicon carbide drift layer forming a Schottky contact with the silicon carbide drift layer.

2. The silicon carbide semiconductor device according to claim 1, wherein a combined area of the plurality of first silicon carbide doped regions and the plurality of second silicon carbide doped regions is less than 25% area of the active region.

3. The silicon carbide semiconductor device according to claim 1, there is a minimum pitch between any adjacent two of the plurality of first silicon carbide doped regions; and a ratio of the first minimum width to the minimum pitch is between 1% to 50%.

4. The silicon carbide semiconductor device according to claim 1, wherein the second minimum width is larger than the combination of the first minimum width and the first spacing.

5. The silicon carbide semiconductor device according to claim 1, wherein the plurality of firs silicon carbide t doped regions have a shape of circle, square, rectangle, hexagon or stripe.

6. The silicon carbide semiconductor device according to claim 1, wherein the plurality of second silicon carbide doped regions have a shape of circle, square, rectangle, hexagon or stripe.

7. The silicon carbide semiconductor device according to claim 1, wherein the metal layer comprises titanium, molybdenum, nickel, aluminum, titanium nitride, molybdenum nitride, nickel nitride, aluminum nitride, titanium oxide, molybdenum oxide, nickel oxide, aluminum oxide or the combination of above.

8. A silicon carbide semiconductor device, comprising:
    a silicon carbide drift layer, having a first conductivity type and a surface in which an active region is defined;
    a plurality of first silicon carbide doped regions, having a second conductivity arranged regularly by Euclidean tilings of regular polygons within the active region; wherein each of the plurality of first silicon carbide doped regions has a first minimum width and a first area and are spaced from each other by a first minimum spacing; and
    a plurality of second silicon carbide doped regions having the second conductivity arranged regularly within the active region; wherein each of the plurality of second silicon carbide doped regions has a second minimum width greater than the first minimum width and a second area greater than the first area, and is spaced from the first silicon carbide doped regions by a second minimum spacing that is less than the first minimum spacing;
    at least one third doped region having the second conductivity arranged within the active region; wherein the at least one third doped region is significantly larger than each of the plurality of first silicon carbide doped regions;
    a metal layer disposed on the surface of the silicon carbide drift layer forming a Schottky contact with the silicon carbide drift layer.

9. The silicon carbide semiconductor device according to claim 8, wherein a combined area of the plurality of first silicon carbide doped regions, the plurality of second silicon carbide doped regions and the at least one third silicon carbide doped regions is less than 25% area of the active region.

10. The silicon carbide semiconductor device according to claim 8, there is a minimum pitch between two centers of two adjacent first silicon carbide doped regions; and a ratio of the first minimum width to the minimum pitch is between 1% to 50%.

11. The silicon carbide semiconductor device according to claim 8, wherein the second minimum width is larger than the combination of the first minimum width and the first spacing.

12. The silicon carbide semiconductor device according to claim 8, wherein the plurality of first silicon carbide doped regions have a shape of circle, square, rectangle, hexagon or stripe.

13. The silicon carbide semiconductor device according to claim 8, wherein the plurality of second silicon carbide doped regions have a shape of circle, square, rectangle, hexagon or stripe.

14. The silicon carbide semiconductor device according to claim 8, wherein the at least one third doped region have a shape of circle, square, rectangle, hexagon or stripe.

15. The silicon carbide semiconductor device according to claim 8, wherein the metal layer comprises titanium, molybdenum, nickel, aluminum, titanium nitride, molybdenum nitride, nickel nitride, aluminum nitride, titanium oxide, molybdenum oxide, nickel oxide, aluminum oxide or a combination of the above.

16. The semiconductor device according to claim 8, wherein the at least one third doped region is arranged at a location within the active region in accordance with a landing position of an assembly bonding wire or a clip.

* * * * *